(12) United States Patent
Bedarida et al.

(10) Patent No.: US 7,158,415 B2
(45) Date of Patent: Jan. 2, 2007

(54) SYSTEM FOR PERFORMING FAST TESTING DURING FLASH REFERENCE CELL SETTING

(75) Inventors: Lorenzo Bedarida, Vimercate (IT); Simone Bartoli, Cambiago (IT); Stefano Surico, Milan (IT); Massimiliano Frulio, Milan (JP)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/089,268

(22) Filed: Mar. 24, 2005

(65) Prior Publication Data

US 2006/0140030 A1  Jun. 29, 2006

(30) Foreign Application Priority Data

Dec. 23, 2004  (IT)  ............... MI2004A2473

(51) Int. Cl.
*G11C 16/10* (2006.01)
(52) U.S. Cl. ............ 365/185.2; 365/201; 365/210
(58) Field of Classification Search ............ 365/185.2
See application file for complete search history.

(56) References Cited

U.S. PATENT DOCUMENTS

| 5,386,388 | A | | 1/1995 | Atwood et al. ............. 365/201 |
| 5,444,656 | A | | 8/1995 | Bauer et al. ............ 365/189.01 |
| 5,608,679 | A | | 3/1997 | Mi et al. ..................... 365/201 |
| 5,784,314 | A | * | 7/1998 | Sali et al. ................. 365/185.2 |
| 5,822,250 | A | | 10/1998 | Krzentz ................. 365/185.29 |
| 6,278,634 | B1 | * | 8/2001 | Ra .......................... 365/185.2 |
| 6,418,054 | B1 | | 7/2002 | Hollmer .................. 365/185.2 |
| 6,466,480 | B1 | * | 10/2002 | Pekny ..................... 365/185.2 |
| 6,584,017 | B1 | * | 6/2003 | Maayan et al. ........ 365/185.22 |
| 6,639,849 | B1 | * | 10/2003 | Takahashi et al. ..... 365/189.07 |

\* cited by examiner

*Primary Examiner*—Tan T. Nguyen
(74) *Attorney, Agent, or Firm*—Schneck & Schneck; Thomas Schneck

(57) ABSTRACT

An embedded circuit in a memory device is used in place of an external test device to perform time-consuming tasks such as voltage verification during the setting of reference cells. An external test device programs at least one reference cell to a predetermined value. The embedded circuit uses the cell programmed by the external device as a comparative reference to program additional reference cells.

27 Claims, 6 Drawing Sheets

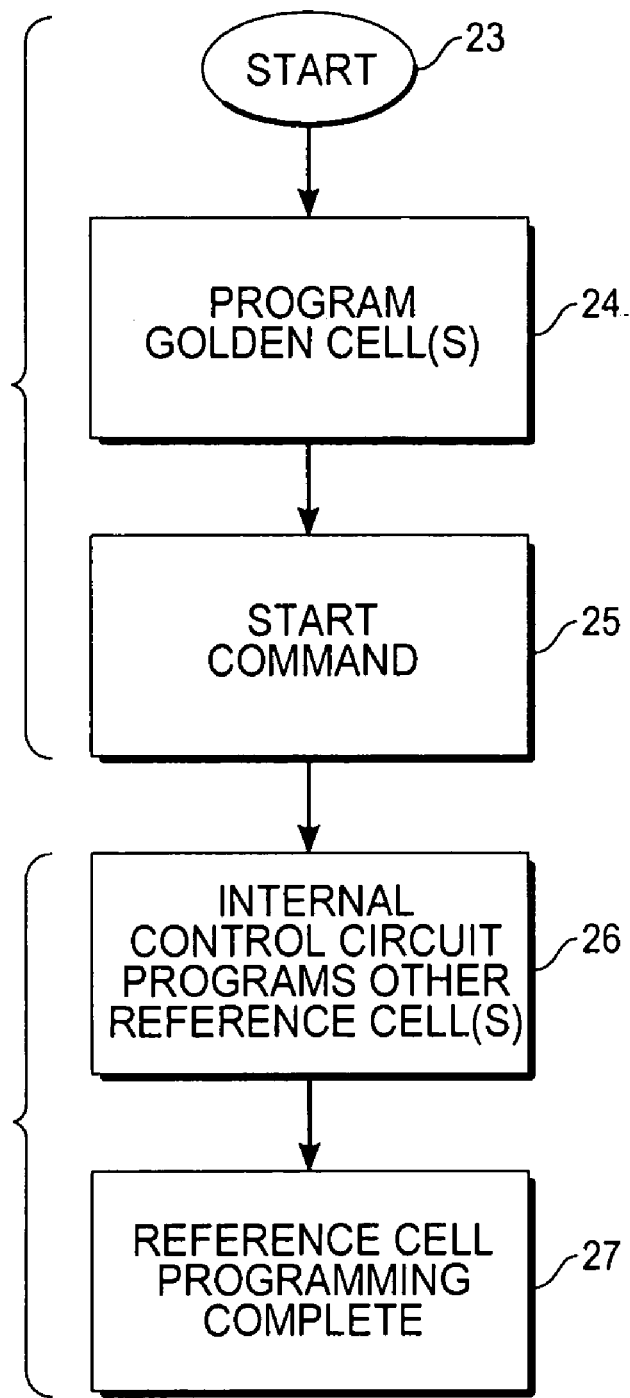
Fig._1

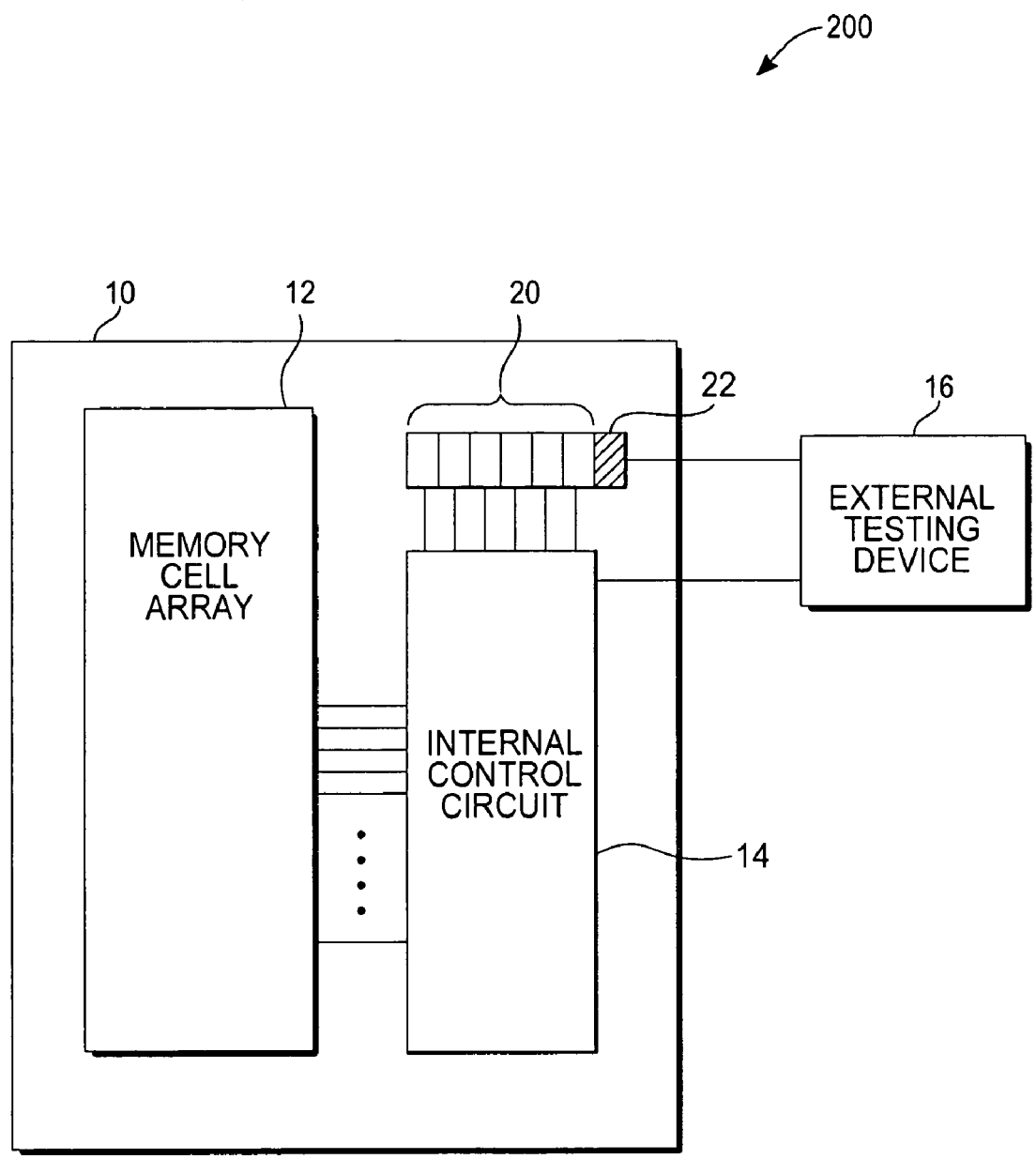
Fig._2

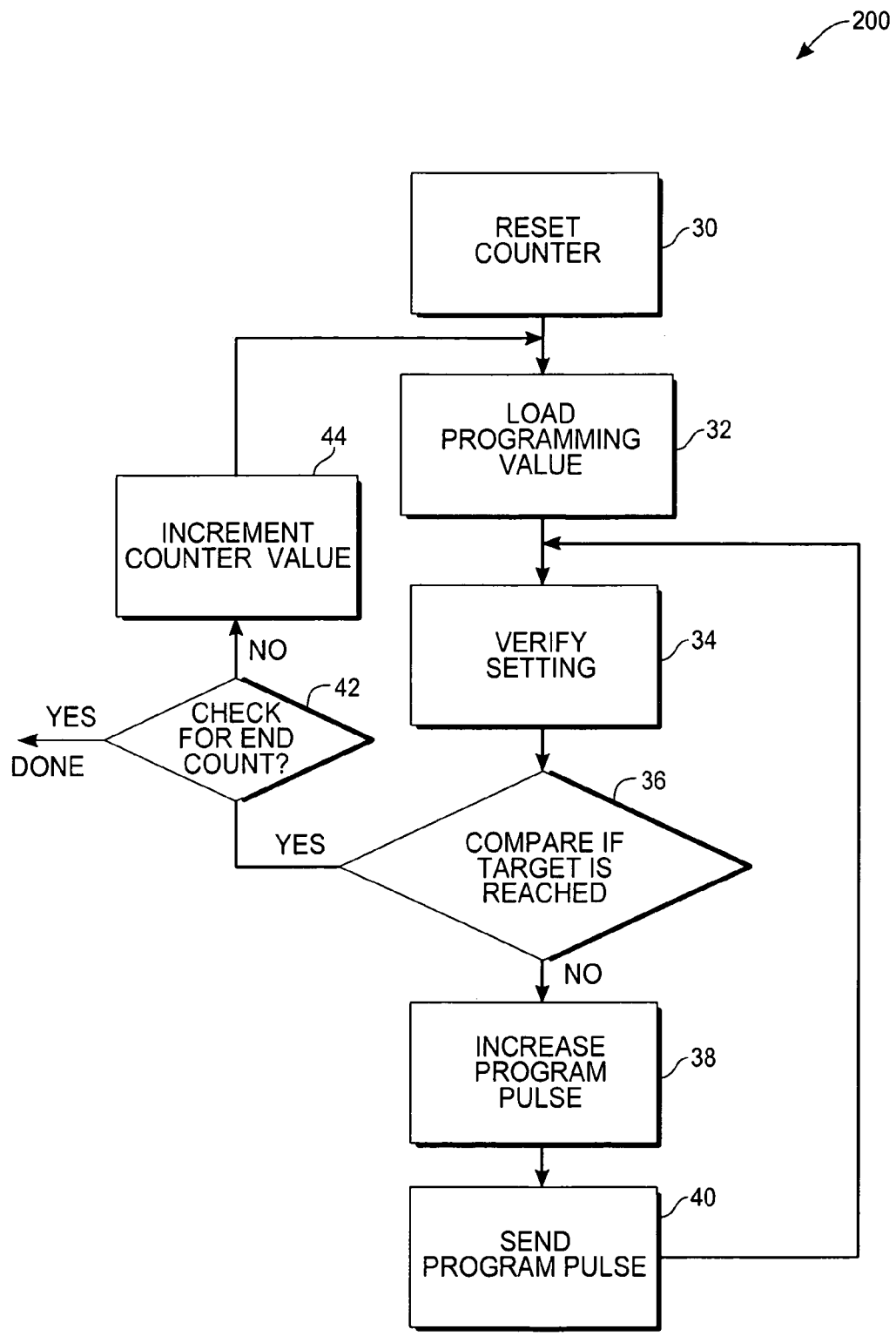
Fig._3

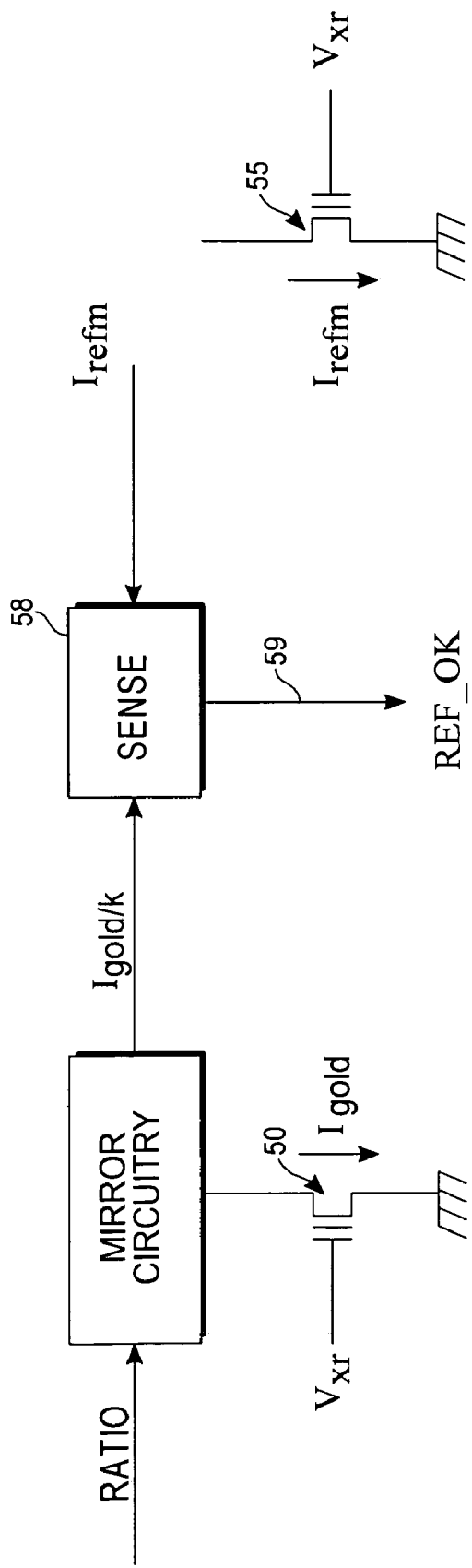
Fig. _ 4A

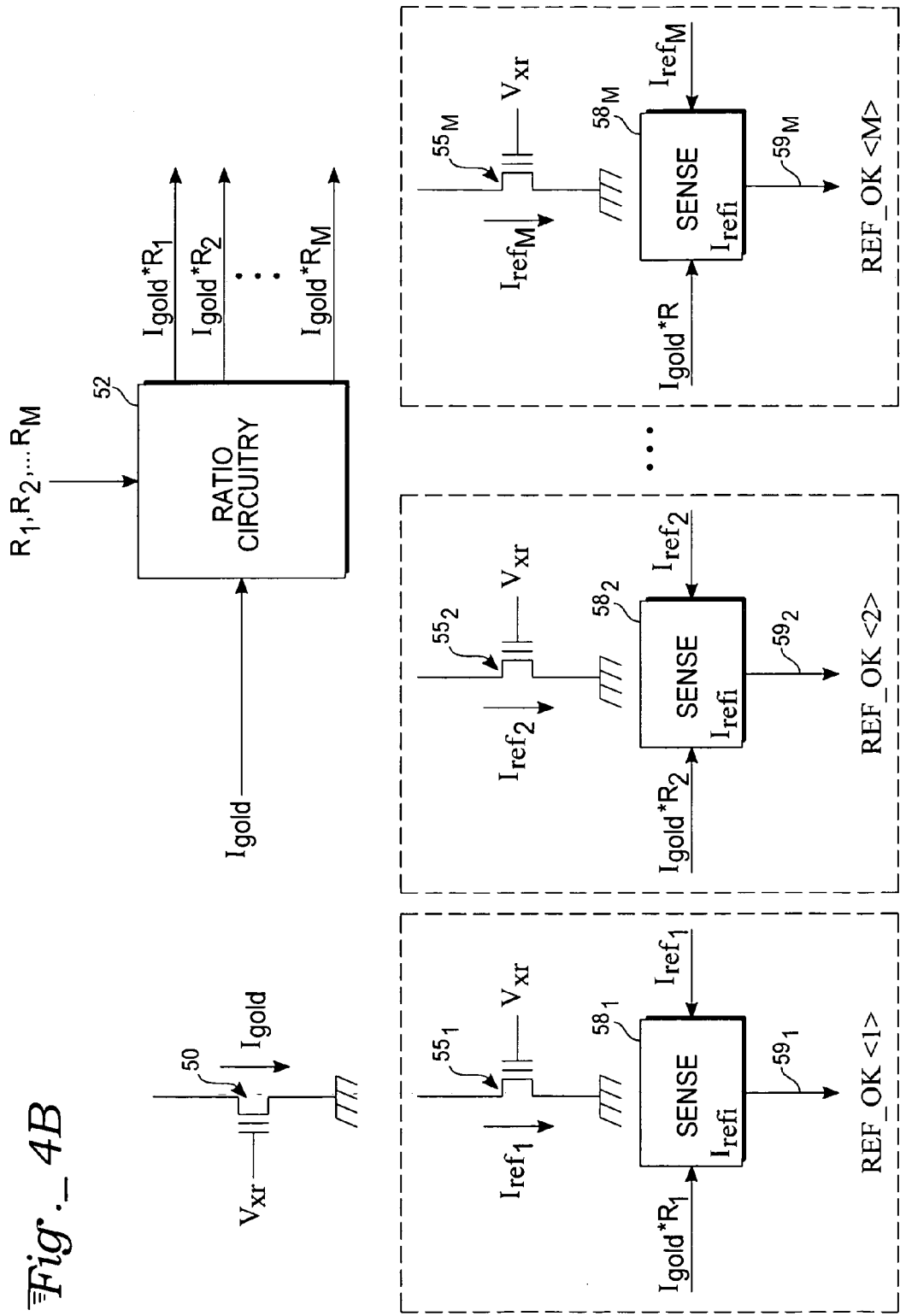
Fig._4B

SYSTEM FOR PERFORMING FAST TESTING DURING FLASH REFERENCE CELL SETTING

TECHNICAL FIELD

The present invention relates to memory devices and in particular, to a system and methods of programming reference cells in a flash memory device.

BACKGROUND ART

A typical flash memory device includes an array of memory cells for the storage of data, a control circuit for handling the input, output, and storage of data, and a reference cell array for providing a set of reference standards each having a threshold voltage that has been precisely set by an external voltage setting machine.

A typical flash memory cell is programmed by inducing hot electron injection from the channel region near the drain to the floating gate. Erasure of a flash memory cell is typically carried out by Fowler-Nordheim tunneling between the floating gate and the source or between the floating gate and the substrate. Either programming or erasure of a flash cell results in a non-volatile threshold voltage $V_t$ in the programmed or erased cell.

During a flash memory operation such as a memory reading, programming, erasing, or verifying, the state of a selected memory cell is compared to a state of a reference cell in the reference array specifically programmed for the operation being performed. For instance, to determine whether a specific memory cell has been programmed or erased properly, the threshold voltage of a reference cell in the reference array is compared to the threshold voltage of a reference memory cell. A sensing circuit that resides in the control circuit is used to perform the voltage comparison between the memory cell and the reference cell.

The reference cell array is typically composed of a set of reference cells each having a pre-programmed threshold voltage $V_t$ that is appropriate for a specific memory operation. Currently, the programming of the reference cells is typically performed by an external testing device. During the reference cell programming process, the external device machine sends a series of programming pulses to the reference cell to induce hot electron injection. The threshold voltage $V_t$ of the reference cell is then measured or read to determine if a desired threshold voltage $V_t$ has been achieved. If $V_t$ is below the desired value, more programming pulses are sent to the reference cell. This process of programming/erasing and/or reading is repeated until the desired threshold voltage is reached.

The repetitive process of programming, reading, and erasing of the reference cell is very time consuming. The most time intensive portion of the procedure is related to the reading step wherein a voltage is applied to the gate and drain of each reference cell and the resulting current is measured by the testing device using a direct memory access (DMA) method. For instance, it usually takes at least 10 DMA readings of a reference cell during a testing and setting process before an accurate voltage is achieved and each DMA reading may take at least 50 ms. So, the minimum time it takes to set a single reference cell is 500 ms. Higher precision requires more DMA readings and in some instances, the time it takes to set a highly precise reference could be ten times that for a regular cell. With an increasing need for multilevel devices that require multiple reference cells set at a wide range of threshold voltage, $V_t$, values, the reference cell testing and setting time becomes very long. For devices with dual work feature, the number of reference cells increases significantly and the reference cells testing and setting time could become unacceptably high. Therefore, it would be desirable to have a system and method for testing and setting reference cells that significantly reduces the total testing and setting time.

U.S. Pat. No. 6,418,054 to Hollmer entitled "Embedded Methodology to Program/Erase Reference Cells used in Sensing Flash Cells" teaches a method of using internal circuits to set reference cells in UV (ultra violet) sensitive or UV erasable EPROMs. Such internally derived reference standards may be usable for certain memory devices. However, these internal reference setting mechanisms are susceptible to internal variations inherent in the memory chip and thus, they are not suitable for applications where highly precise reference standards are required. An example of such an application is a multilevel memory cell device that requires a fixed range of a multilevel threshold voltage distribution that has a very small tolerance. Therefore, it would also be desirable to have a reference setting system that can provide a set of highly precise reference thresholds.

SUMMARY OF THE INVENTION

A system and method of programming memory reference cells that uses an embedded or an internal control circuit of a memory device, such as a flash memory or an EEPROM, to perform some of the time consuming portions of a cell programming process is described herein.

Referring to FIG. 1, an external testing device or other programming device is coupled to a memory device. The activity performed by the external testing device 24, as well as the activity by an internal control circuit 26 is shown. The procedure begins by applying power and initializing any parameters that may be used by the external testing device when programming cells within the memory device 23. For example, if a memory device is an integrated circuit, the external testing device may be a circuit coupled to the memory device's pins or contact pads. Next at 24, the external testing device programs at least one reference cell within the memory device to a precise value, such as a threshold voltage value $V_t$ or a current value $I_g$.

Reference cell(s) programmed by the external testing device will hereafter be referred to as "golden cells." Other "non-golden" reference cells within the flash memory device will be referred to as "reference cells." Once the testing device has completed programming the required number of golden cells, the tester does not program any remaining cells within the memory device. The golden cell(s) will be used as a comparative standard to set other additional reference cells.

After at least one golden cell has been set, the external testing device or other device instructs 25 an internal control circuit embedded within the memory device to begin setting other reference cells. For example, a latch may be set or a command may be sent to the internal control circuit, indicating that the external device has finished programming at least one golden cell and the internal control circuit should now begin to set or program other internal control reference cells. Next, the reference cells are sequentially programmed 26 by the internal control circuit or alternatively, the reference cells may be simultaneously programmed by multiple sets of circuit inside the memory device. The internal control circuit then iteratively programs and compares the programmed reference cells to at least one of the golden cells.

When the required number of reference cells have been set by the internal control circuit, the reference cell programming operation is complete, and the internal control circuit ceases the reference cell programming operation 27. The iterative programming and comparison operation performed by the internal control circuit relieves the external testing device from the task of programming all of the required number of reference cells within the memory device.

BRIEF DESCRIPTION OF THE DRAWINGS

FIG. 1 is a flow chart showing a general procedure of the present invention.

FIG. 2 is a block diagram showing an embodiment of the present invention.

FIG. 3 is a flow chart showing an algorithm for programming a plurality of reference cells according to the present invention.

FIG. 4 is an exemplary circuit that may be used to implement the flowchart illustrated in FIG. 3.

BEST MODE OF CARRYING OUT THE INVENTION

Figure 5:
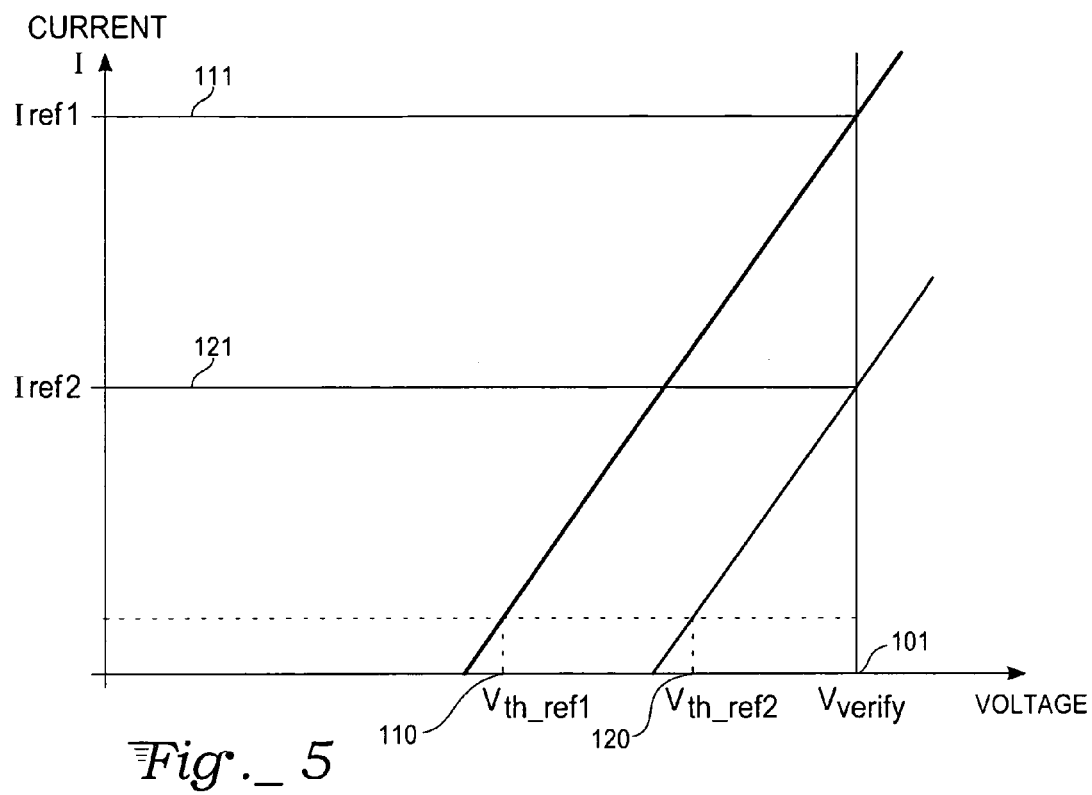
FIG. 5 illustrates ideal voltage and current characteristics for two exemplary reference cells.

With reference to FIG. 2, flash memory device 10 has a memory cell array 12. The memory cell array 12 is comprised of a plurality of flash memory cells (not shown). Programming, reading, and erasing reference memory cells in the memory cell array 12 is carried out by an internal control circuit 14. The internal control circuit 14 contains state machine logic (not shown) for the execution of various memory accessing functions, a plurality of sensing circuits (not shown) for the reading of the memory cells, a plurality of addressing logic units for the proper selection of memory cells, and a plurality of input/output logic units (not shown) for the input and output of data. During the reading of memory cells, a group of reference cells 20 provide standard references for comparison to other memory cells in the memory cell array.

A golden cell 22 provides a precise, optimal, and pre-defined reference or absolute threshold value that may be used to set or program at least one additional reference cell. An external testing device 16 connects to a golden cell 22 that will be used later as a standard comparative cell when programming at least one other reference cell.

In one embodiment, the external testing device 16 programs at least one golden cell 22 to a specific threshold voltage by repeating the steps of sending programming pulses to the golden cell 22 and then measuring a resulting threshold voltage using a direct memory access DMA method. The golden cell 22 may be fully programmed/erased using controlled program/erase pulses to set a threshold voltage. Since DMA measurement is an accurate method for measuring the threshold voltage, this step of establishing a golden voltage is used to establish an accurate reference for later setting a group of additional reference cells 20.

After the external testing device 16 (using a starting program voltage, programming pulses, steps between pulses, and voltage verification) has set the required number of golden cells, the external testing device 16, does not set the other additional reference cells 20. Next, the external testing device 16, instructs the internal control circuit 14 that the internal control circuit 14 may begin to set at least one internal reference cell 20. For example, the external testing device 16 may provide a command to the internal control circuit 14, or set a latch or line to a pre-determined logic value. After the external testing device 16 has provided a command to the internal control circuit 14 to begin, the external testing device 16 no longer sets any reference cell(s) 20. The internal control circuit 14 then uses at least one programmed golden cell 22 as a standard comparative reference to set or program at least one reference cell(s) 20 within the memory device. The internal reference cell(s) 20 to be set may be selected from the group of reference cells 20 embedded in the memory device 10 and may be programmed individually (one at a time) or simultaneously.

A reference cell may be changed to obtain a target threshold value $V_M$ using a target voltage threshold, or by using a target current setting means $I_m$. In one embodiment, the internal control circuit performs a current comparison between the golden cell 22 and a single reference cell 20. In alternative embodiments, multiple reference cell currents may be verified and compared with a pre-programmed golden cell.

Referring to FIG. 4A, an embodiment of a voltage threshold setting procedure for a selected reference cell 55 may be implemented by programming a single reference cell or serially programming multiple reference cells one-by-one. For programming a single reference cell, only a single sense circuit 58 and a single indicator line 59 is required. In particular, for a threshold setting method, the selected ratio device may be set so that the current ratio between a golden cell 50 and a selected reference cell 55 is equal to unity (=1). The sense amplifier, for each reference cell 55, will verify that:

$$I_{ref\text{-}cell} \text{ (with } V_{gateci}=V_{thi}) = I_{golden\_cell} \text{ (with } V_{gateg}=V_{tg})$$

where $V_{thi}$ is the target threshold for the reference cell being set, and $V_{tg}$ is the threshold of the golden cell. Also, during the setting of a selected reference cell 55, a gate voltage of a golden cell 50 may be different than a gate voltage of the selected reference cell 55.

In one embodiment of a reference cell setting procedure, as shown in FIG. 3, an exemplary algorithm 200 is activated by the internal control circuit to perform a series of steps to set the threshold voltage for each reference cell within the set of reference cells 20. In one embodiment, buffers (not shown) in the internal control circuit 14 are loaded with a set of desired threshold voltage values ranging from $V_{ref1}$ to $V_{refm}$, where variable m refers to a number of corresponding reference cells to be set.

At the start of the algorithm 200, a counter 30 that keeps track of the number of reference cells is reset to an initial value. For instance, the counter may be reset to 1 at the beginning of each programming routine to indicate that a first reference cell within the group of reference cells 20 is to be programmed. Based on the target threshold voltage $V_1$, for the first reference cell, a start programming voltage value is loaded 32 into a programming circuit that resides in the internal control circuit 14.

The threshold voltage of the first reference cell may be verified 34 using an internal control circuit that is similar to those used for sensing normal memory cells. The operation matches a particular reference cell to a pre-set golden cell by comparing 36 the reference cell's measured threshold voltage with the target cell threshold voltage value $V_1$.

If the measured threshold voltage of the first reference cell does not match that of the target threshold voltage value $V_1$, then the algorithm proceeds to increase a gate voltage to a value higher than the previously applied voltage, such as 0.125 Volts higher from an exemplary 4.0 Volts to 4.125 Volts, and sends an additional programming pulse to the first reference cell 40. The threshold voltage of the first reference cell is then verified 34 again. Once the target threshold voltage is reached, the reference cell is properly programmed. If the measured threshold voltage of the first reference cell matches that of the target threshold voltage value $V_1$ stored in the buffer, then the algorithm proceeds to check whether more reference cells are to be programmed.

If the last reference cell has not been programmed or set, the cell counter is incremented 44 and the next reference cell is then programmed. If the last reference cell has been programmed, a determination 42 is made that the end count has been reached, and the threshold voltage setting algorithm is terminated (done).

In an alternate embodiment verification and comparison operations of a reference cell may be implemented. In general, the threshold of the reference cell may be changed to obtain a target threshold value $V_m$ using a target current $I_M$ to set the reference cell. Similar to the steps in FIG. 3, the steps to verify 34 a threshold setting and subsequent steps 36–44 may be implemented by performing a current comparison between a reference cell and a golden cell.

In another embodiment, using a current setting approach, an internal control circuit performs a current comparison 36 between the golden cell current, with a predetermined or fixed voltage applied to the golden cell gate (usually the read voltage), and each reference cell current (or its ratio), with the same predetermined or fixed voltage applied to each reference cell gate. Generally, the golden cell current $I_g$ will be measured and compared 36 with reference cell(s) current using a selected or predetermined word line supply voltage. The reference cell(s) current will be measured using a particular gate voltage $V_g$. However other voltage references be used.

After a golden cell 22 is pre-programmed by the external testing device 16, a reference cell 20 may be set using an internal control circuit 14. Reference cell 20 characteristics are compared to the programmed golden cell 22, using voltage threshold $V_{tg}$ or cell current.

Using a current $I_{th}$ to define a voltage threshold (in the threshold reference setting process) does not require $I_{th}$ to be equal to the golden current used in the current reference setting. A golden cell 22 is typically pre-programmed by an external testing device 16 to a defined voltage threshold Vtg. A particular voltage threshold Vtg for the golden cell 22 is associated with a particular current threshold $I_{th}$ that is chosen to define the voltage threshold value of a cell. Typically, the golden cell is defined to have a threshold $V_{tg}$ if it sinks a pre-chosen current ($I_{th}$) when its gate is $V_{tg}$. This current $I_{th}$, used to define a voltage threshold, is usually a very low current, for example, 1 uA to 2 uA. The current value may be chosen to define a voltage flash threshold using 1 ua $I_{th}$ current, so that golden cell may have a threshold of 2 Volts only when it sinks 1 uA when the gate voltage is 2 Volts. Alternatively in a current reference setting approach, an $I_g$ (gate) current comparison is defined, and is set at a chosen fixed gate voltage value, normally equal to the read mode gate voltage. The golden current comparison $I_g$ may be defined using chosen voltage parameters, for example 20 microamps, when its gate is equal to a read gate value $V_{xr}$. The $V_{xr}$ value may be pre-programmed by the external testing device 16 into a golden cell 22.

With further reference to FIG. 3, a comparison may be made between a golden cell 22 current $I_g$, or a multiple or fraction of $I_g$, and a single reference cell current $I_{refM}$ while applying a pre-determined voltage ($VT_{rM}$) value, that is stored in a load programming value 32 register, to both the gate of the golden cell 22 (shown in FIG. 2) and to the gate of a reference cell 20 (shown in FIG. 2). After a counter reset 30 and loading 32 a programming current value steps for a particular reference cell are completed, a current verification is performed 34 on the reference cell 20, followed by a comparison 36 between the golden cell current $I_g$ (or a multiple or fraction of $I_g$) and the reference cell current $I_{refM}$. If $I_{refM} > I_g$ (or a multiple or fraction of $I_g$), then the desired programmed threshold set for the reference cell is not desirable, and must be changed. In one embodiment, additional adjustment pulses are sent 40 until the desired condition occurs where the golden cell current $I_g$ (or a multiple or fraction of $I_g$) is equal to the reference cell current $I_{refM}$. The reference cell will continue to be programmed (or erased) until the current threshold in the reference cell is equal to the current threshold (or a multiple or fraction of $I_g$) in the golden cell.

In one embodiment, the external testing device 16 programs the golden cell 22 to a particular current value $I_{current}$ at a particular read voltage $V_{read}$. With continued reference to FIG. 3, a particular reference cell current $I_{refM}$ is loaded 30 into the programming value register. This current value is the desired reference cell current when the reference cell gate is equal to the read voltage $V_{read}$ of the golden cell 22.

In another embodiment, reference cell current $I_{refM}$ may be set at a fraction or multiple of a golden cell current $I_g$. For example, the golden cell 22 may be set to sink $I_g$ when a read voltage $V_{read}$ ($V_{xr}$) is applied to its gate. The internal control circuit 14 may also configure a ratio coefficient $R_i$ for the reference cell current $I_{refi}$ so that: $I_{refi} = I_g R_i$ when both the golden reference and reference cell gate are $V_{xr}$.

An exemplary circuit of FIG. 4A performs a current verification and/or comparison between a golden cell 50 and at least one reference cell 55. A verify control gate voltage $V_{xr}$ is applied to at least one golden cell 50. The same value of gate voltage is applied to at least one reference cell 55. The gate voltage is applied to at least one word line. In general, the golden cell gate voltage $V_{gs}$ and the reference cell gate voltage will be equal to a read voltage $V_{read}$ in the current threshold method.

A sense circuit 58 monitors the drain current of the golden cell 50 and the drain current(s) of at least one reference cell 55. The sense circuit 58 compares the golden cell drain current with the drain current of at least one reference cell 55. If the current value from the golden cell 50 matches the current value from at least one reference cell (or a ratio, see below), the sense circuit 58, relative to the matching reference, will provide a signal on an indicator line 59 indicating that the current values match. Referring to FIG. 3, if the current values (or a multiple or fraction) do not match, a program pulse will be sent 40 to at least one reference cell 20 not yet matching a target current until the current values match the target currents.

Referring to FIG. 4B, at least one ratio (coefficient value $R_1, R_2, \ldots R_M$) may be used for each reference cell 55, $-55_M$ such that using a current method to set multiple reference cells in parallel:

$$I_{refM} \text{ (with } V_{gate} = V_{xr}) = I_g \text{ (with } V_{gate} = V_{xr}) * R_M.$$

For each reference cell:

$$I_{ref1} \text{ (with } V_{gate}=V_{xr}) = I_g \text{ (with } V_{gate}=V_{xr})*R_1$$

$$I_{ref2} \text{ (with } V_{gate}=V_{xr}) = I_g \text{ (with } V_{gate}=V_{xr})*R_2$$

Such that for the i-th reference cell:

$$I_{refi} \text{ (with } V_{gate}=V_{xr}) = I_g \text{ (with } V_{gate}=V_{xr})*R_i.$$

Where $R_1, R_2, \ldots R_M$ are the desired ratio coefficients.

In one embodiment, for a single reference cell, $R_i$ is set at a unitary ratio (=1), and the reference cell current is that same as the golden cell current $I_{gold}$. In another embodiment setting multiple cells, the ratio circuitry 52 is set for a selected number of reference cells so that the target output currents $I_gR_1, I_gR_2, \ldots I_gR_M$ are set. An M (multiple) number of sense circuits 58 are used to sense the currents $R_i*I_{golden\_cell}$ to set M references in parallel. In one embodiment, when setting multiple reference cells, each sense amplifier will provide an indication when each cell has been properly programmed, for example by toggling an indicator line 59 that exists for each reference cell that is being set. In one embodiment, if all the reference cells are not correctly set, then the next program pulse will only be applied to those reference cells that are not correctly set. A reference cell setting procedure ends when all the targeted reference cells have been correctly set. Applying the coefficient to a plurality of reference cells $55_1$–$55_M$ allows a single golden cell 50 to be compared with more than one reference cell $55_1$–$55_M$ in a single current comparison operation. The ratio coefficient value $R_i$ may multiply or apply a fraction to the current value of each reference cell 55.

For example, thirty-two reference cells 55 may be measured in one operation, with the ratio coefficient Ri applied to at least one ratio device $52_1$ to $52_M$. The current in each reference cell 55(i) is equal to the current $I_g$ (in the gold cell) divided by the corresponding reference coefficient $R_i$, such that $I_{ref\_cell(i)} = I_{golden\_cell}/R_i = I_g/R_i$. For example, with a read gate voltage of 5.5 Volts and the golden cell current $I_g$ equal to 20 microamps ($V_{gateg}=V_{xr}$) and with a ratio coefficient $R_i=2$, the reference cell (i) should have a desired current of 10 microamps when its gate $V_{gateri}=V_{xr}$, while reference j with ratio coefficient $R_j=4$ should have a desired current of 5 microamps when its gate $V_{gaterj}=V_{xr}$.

With reference to FIG. 5, a verify voltage $V_{verify}$ 101 is greater than any of the threshold voltages $V_{th\_refm}$ 110, 120 of the referenced cells when performing a verify or read operation. When comparing cells, if the voltage threshold $V_{th}$ of a reference cell $V_{th\_ref1}$ 110 is lower than the voltage threshold of another reference cell $V_{th\_ref2}$, 120, the current for the first reference cell $I_{ref1}$ 111 will be higher than the current for the second reference cell $I_{ref2}$ 121. In this ideal situation, each reference cell will maintain the same change in voltage and current when erased and programmed, and will provide reliable results during a read or verify operation using a verify voltage $V_{verify}$ 101. When changing the threshold voltage for either reference cell, a reference cell will track the other reference cell's threshold voltage and current, and a generic memory cell may be correctly erased, programmed, or read using either reference cell.

Reference cells having the same gain provides uniform performance of all the reference cells in a memory device. It is desirable to avoid different gains between the reference cells, however, it is difficult to match the gains of all reference cells and generic memory cells within a memory array. A distribution of gains and a distribution of thresholds are the normal outcome for a memory array manufacturing process. A mismatch of the gains of reference cells reduces the current margin allowed to correctly read a logic value of a particular generic memory cell within a memory array.

Figure 6:
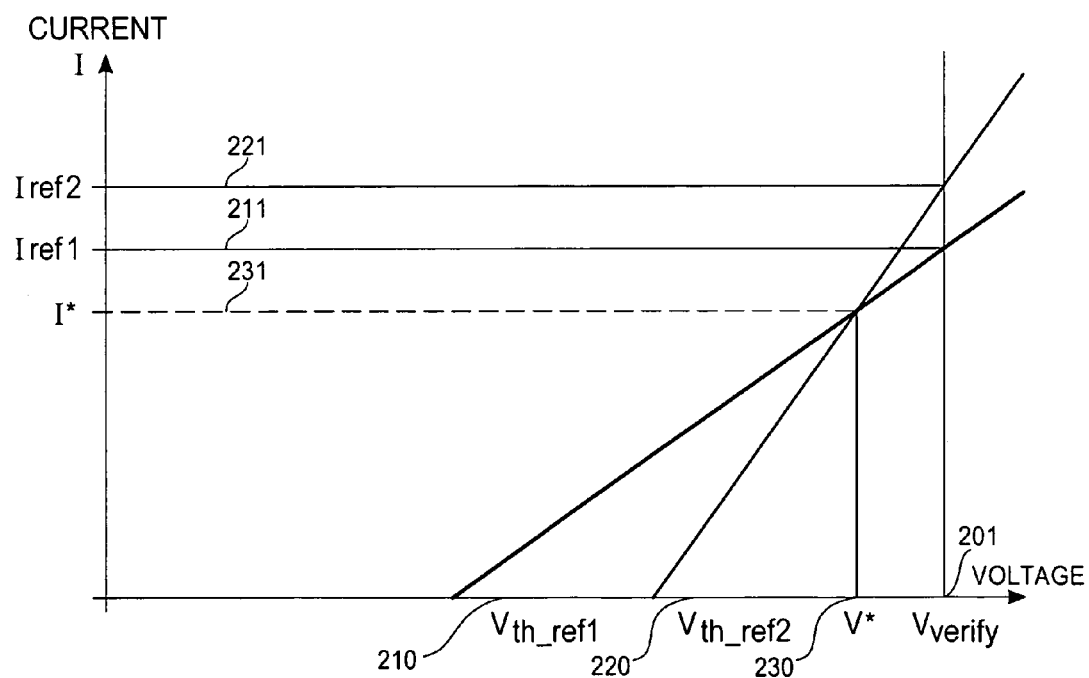
FIG. 6 illustrates actual voltage and current characteristics for two exemplary reference cells.

With reference to FIG. 6, a verify voltage $V_{verify}$ 201 is greater than the threshold voltages $V_{th\_refm}$ 210, 220 of the reference cells when performing a verify operation. When comparing cells having different gains, if the voltage threshold $V_{th}$ of a reference cell $V_{th\_ref\ 1}$ 210 is lower than the voltage threshold of another reference cell $V_{th\_ref2}$, 220, the current for the first reference cell $I_{ref1}$ 211 may be less than the current for the second reference cell $I_{ref1}$ 221 during a verify operation. This difference between the gain of the reference cells may cause an incorrect read or verify value. For example, if we use $V_{verify}$ as a read or verify voltage and the voltage-current line for $V_{th\_ref2}$ 220 as a reference, a cell having the voltage current characteristics associated with $V_{th\_ref1}$ 210 would be read as a logic value 0 instead of an intended logic value of 1 because $I_{ref1} < I_{ref2}$. In this situation, using a verify voltage that exceeds V* 230 will produce a reference cell margin that is too narrow and may incorrectly read the logic value of another cell. To improve reliability, a golden cell may be precisely set to a particular current value to reduce read failures due to differences in gain of the reference cells. For example, if the golden cell and reference cells are set to a current value equal to $I_{ref2}$ 221 when $V_{gate}=V_{verify}$, the voltage-current line of a reference cell having the characteristics of $V_{thref1}$ 210 will be set so that the voltage-current lines of both reference cells $V_{th\_ref1}$ 210 and $V_{th\_ref2}$ 220 will intersect at $I_{ref2}$ 221 when $V_{gate}=V_{verify}$, thus improving reference cell margin, and improving the reliability of a read or verify operation. Therefore, if a current method is used to set the reference cells, the reliability of the memory array will increase when reading a logic value stored in a generic memory cell.

In the above disclosure, the invention relieves the external testing device 16 from having to program all the reference cells 20 within the memory device 10. To illustrate the time saving achieved by using the present invention, assume that M is the number of reference cells to be set and $C_i$ denotes the i-th reference cell, where $1 \leq i \leq M$. $C_r$ denotes the golden cell, N is the average number of programming pulses used for setting each cell, $T_{set\_Cr}$ is the total time for setting the golden cell, and $T_{set\_Ci}$ is the total time for setting the $i^{th}$ reference cell. Using a traditional method of using an external testing device for the setting all the reference cells, the total time ($T_{tot\_test\_device}$) is $$T_{tot\_test\_machine} = M \cdot N \cdot (T_{prog}+T_{DMA})$$

where $T_{prog}$ is the time for sending a programming pulse, and $T_{DMA}$ is the time for dynamic memory access from the external testing device. Assume $T_{DMA}=50$ ms, $T_{prog}=1$ ms, M=20, and N=10, the $T_{tot\_test\_device}$ is about 10 seconds. Alternatively, with verification process performed by the internal control circuit of the present invention, $$T_{set\_C_r} = N \cdot (T_{prog}+T_{DMA})$$

$$T_{set\_C_i} = N \cdot (T_{prog}+T_{ver\_emb})$$

where $T_{ver\_emb}$ is the time for verifying the threshold voltage using an internal control circuit, $T_{ver\_emb}$ is negligible with respect to a $T_{DMA}$ of 50 ms to 100 ms. The total time $T_{tot\_emb}$ for setting all the reference cells in the memory device is $$T_{tot\_emb} = T_{set\_C_r} + M \cdot T_{set\_C_i}$$

Based on the same assumption that $T_{DMA}=50$ ms, $T_{prog}=1$ ms, M=20, and N=10, $T_{tot\_emb}$ is now only about 0.5 seconds. As a result, a total time for the external test device to program all of the reference cells within the memory device is greatly reduced. Additionally, since it is possible to program multiple memory devices (such as multiple dies by a testing device simultaneously), the time savings may be multiplied by the number of dies simultaneously tested.

It is to be understood that the above description is intended to be illustrative, and not restrictive. Those of skill in the art will recognize that the invention can be practiced with modification and alteration within the spirit and scope of the appended claims. Embodiment(s) of the invention so described may include a particular feature, structure, or characteristic, but not every embodiment necessarily includes the particular feature, structure, or characteristic described. Repeated use of the phrase "in one embodiment" does not necessarily refer to the same embodiment, although it may. Many other embodiments will be apparent to those of skill in the art upon reading an understanding the above description. For example, in the embodiment of the present invention disclosed above, there is an internal control circuit that performs the voltage verification of the non-golden cells. However, it is also possible that multiple internal control circuits may be used, and multiple reference cells may be programmed at the same time. The description is thus to be regarded as illustrative instead of limiting. The scope of the invention should, therefore, be determined with reference to the appended claims, along with the full scope of equivalents to which said claims are entitled.

What is claimed is:

1. A system for programming reference cells in a memory device, the system comprising:
   a plurality of reference cells and an internal circuit embedded in and coupled to said memory device;
   a testing device coupled to said memory device, said testing device being configured to program at least one first reference cell to a predetermined value such that the at least one first reference cell provides a specified current $I_g$ where a specified read voltage is applied to that cell's gate; and
   said internal circuit being configured to set at least one of said plurality of other reference cells to specific values using said first reference cell as a comparative standard, wherein the internal circuit includes a ratio circuitry coupled to the at least one first reference cell and to sense circuitry for each of the plurality of other reference cells, the ratio circuitry configured to provide a current $I_g * R_i$ to the sense circuitry for comparison with a current $I_{refi}$ provided by the at least one other reference cell, such that $I_{refi}=I_g * R_i$ where the specified read voltage is applied.

2. The system for programming reference cells in the memory device of claim 1, wherein said specific values are stored as ratio coefficient values $R_i$ in at least one buffer.

3. The system for programing reference cells in the memory device of claim 1, wherein said internal circuit is configured to program reference cells one a time.

4. The system for programming reference cells in the memory device of claim 1, wherein said internal circuit is configured to program reference cells simultaneously.

5. The system for programming reference cells in the memory device of claim 1, wherein a plurality of said memory devices are programmed simultaneously by said testing device.

6. The system for programming reference cells in the memory device of claim 1, wherein said testing device is externally coupled to said memory device.

7. The system for programming reference cells in the memory device of claim 1, wherein said testing device is configured to send a start command to said internal circuit to begin setting at least one of said plurality of reference cells.

8. The system for programming reference cells in the memory device of claim 1, wherein said programming of reference cells is performed to reduce an overall programming time.

9. The system for programming reference cells in the memory device of claim 1, wherein said testing device is configured to program said at least one reference cell by repeating steps of sending a programming pulse to said at least one reference cell and then verifying the threshold voltage of said at least one other reference cell by the current comparison performed by the internal circuit.

10. The system for programming reference cells in the memory device of claim 9, wherein said testing device is configured to execute said program operation or said verity operation using a dynamic memory access method.

11. The system for programming reference cells in the memory device of claim 1, wherein said sense circuitry compares current $I_g$ through a first reference cell set by said testing device to current $I_{refi}$ through at least one other reference cell.

12. The system for programming reference cells in the memory device of claim 11, wherein said internal circuit sets said current $I_{refi}$ through the at least one other reference cell to be equal ($R_i=1$) to said current $I_g$ through a first reference cell set by said testing device.

13. The system for programming reference cells in the memory device of claim 11, wherein said internal circuit sets said current $I_{refi}$ through the at least one other reference cell to be a fraction ($R_i <1$) of said current $I_g$ through a first reference cell set by said testing device.

14. The system for programming reference cells in the memory device of claim 11, wherein said internal circuit sets said current $I_{refi}$ through the at least one other reference cell to be a multiple ($R_i>1$) of said current $I_g$ through a first reference cell set by said testing device.

15. A method for programming reference cells in a memory device, the method comprising:
   programming at least one first reference cell embedded within said memory device to a predetermined value using a testing device such that the at least one first reference cell provides a specified current $I_g$ when a specified read voltage is applied to that cell's gate; and
   programming a plurality of additional reference cells embedded within said memory device using only an internal circuit embedded in said memory device, the internal circuit comparing a current $I_{refi}$ from each additional reference cell to a current $I_g * R_i$ derived from a first reference cell by ratio circuitry in the internal circuit, and setting the additional reference cells so that $I_{refi}=I_g * R_i$ when the specified read voltage is applied.

16. The method for programming reference cells in the memory device of claim 15, wherein said embedded circuit stores specific values for programming said plurality of additional reference cells as ratio coefficient values $R_i$ in at least one buffer.

17. The method for programing reference cells in the memory device of claim 15, wherein said plurality of additional reference cells is programmed one at time by said embedded circuit.

18. The method for programming reference cells in the memory device of claim 15, wherein said plurality of additional reference cells are programmed simultaneously by said embedded circuit.

19. The method for programming reference cells in the memory device of claim 15, wherein said programming of at least one reference cell using a testing device is performed on a plurality of memory devices simultaneously.

20. The method for programming reference cells in the memory device of claim 15, wherein said testing device is externally coupled to said memory device.

21. The method for programming reference cells in the memory device of claim 15, wherein said testing device is configured to send a start command to said embedded circuit to begin setting at least one of said plurality of additional reference cells.

22. The method for programming reference cells in the memory device of claim 15, wherein said programming of a plurality of additional reference cells is performed to reduce an overall programming time.

23. The method for programming reference cells in the memory device of claim 15, wherein said testing device programs said at least one additional reference cell by sending a programming pulse to said at least one additional reference cell and verifies the threshold voltage of said first reference cell by the current comparison performed by the internal circuit.

24. The method for programming reference cells in the memory device of claim 15, wherein said programming a plurality of additional reference cells further comprises:

sending one or more programming pulses to said plurality of additional reference cells from said embedded circuit; and again checking the voltage threshold by said embedded circuit in at least one of said plurality of additional reference cells until $I_{refi} = I_g * R_i$.

25. The method for programming reference cells in the memory device of claim 15, wherein said embedded internal circuit sets said current $I_{refi}$ through at least one additional reference cell to be equal ($R_i =1$) to said current $I_g$ through a first reference cell programmed by said testing device.

26. The method for programming reference cells in the memory device of claim 16, wherein said embedded internal circuit sets said current $I_{refi}$ through at least one additional reference cell to be a fraction ($R_i <1$) of said current $I_g$ through a first reference cell programmed by said testing device.

27. The method for programming reference cells in the memory device of claim 16, wherein said embedded internal circuit sets said current $I_{refi}$ through at least one additional reference cell to be a multiple ($R_i 1$) of said current $I_g$ through a first reference cell programmed by said testing device.

* * * * *